US006975951B1

(12) United States Patent
Sutrave et al.

(10) Patent No.: US 6,975,951 B1
(45) Date of Patent: Dec. 13, 2005

(54) METER APPARATUS AND METHOD FOR PHASE ANGLE COMPENSATION EMPLOYING LINEAR INTERPOLATION OF DIGITAL SIGNALS

(75) Inventors: Praveen K. Sutrave, Sewickley, PA (US); Roger W. Cox, Oakdale, PA (US)

(73) Assignee: Raton Corporation, Cleveland, OH (US)

( * ) Notice: Subject to any disclaimer, the term of this patent is extended or adjusted under 35 U.S.C. 154(b) by 0 days.

(21) Appl. No.: 10/865,476

(22) Filed: Jun. 10, 2004

(51) Int. Cl.[7] .......................... G01R 35/00; G06F 19/00
(52) U.S. Cl. ..................... 702/106; 702/57; 702/70; 702/71; 702/72; 702/75; 702/79; 702/87; 702/88; 324/601; 324/617; 324/622; 324/76.11; 324/76.12; 324/76.52; 324/103 R
(58) Field of Search ....................... 702/106, 57, 70–72, 702/75, 79, 87–88; 324/601, 617, 622, 76.11, 324/76.12, 76.52, 103 R

(56) References Cited

U.S. PATENT DOCUMENTS 4,996,871 A    3/1991   Romano
6,043,642 A    3/2000   Martin et al.
6,748,344 B2 * 6/2004   Mendoza et al. ........... 702/189

* cited by examiner

Primary Examiner—John Barlow
Assistant Examiner—Sujoy K Kundu
(74) Attorney, Agent, or Firm—Martin J. Moran

(57) ABSTRACT

A method compensates for phase differences between sampled values of first and second AC waveforms. The method employs a phase angle compensation factor and sequentially samples a plurality of values of each of the waveforms. For a positive compensation factor, second sampled values are adjusted to correspond with first sampled values by employing, for a corresponding second sampled value, a preceding second sampled value plus the product of: (i) the compensation factor and (ii) the difference between the corresponding second sampled value and the preceding second sampled value. Alternatively, for a negative compensation factor, the second sampled values are adjusted by employing, for the corresponding second sampled value, the preceding second sampled value minus the product of: (i) the sum of one plus the compensation factor and (ii) the difference between the preceding second sampled value and the second sampled value preceding the preceding second sampled value.

22 Claims, 8 Drawing Sheets

METER APPARATUS AND METHOD FOR PHASE ANGLE COMPENSATION EMPLOYING LINEAR INTERPOLATION OF DIGITAL SIGNALS

BACKGROUND OF THE INVENTION

1. Field of the Invention

This invention pertains generally to meter apparatus and, more particularly, to such apparatus receiving one or more first alternating current waveforms and one or more second alternating current waveforms. The invention also pertains to a method for compensating for phase differences between first and second alternating current waveforms.

2. Background Information

In power measurement systems employing, for example, current transformers, it is very important to correct the phase angle of related signals (e.g., current and voltage signals for one or more power line phases), in order to achieve relatively high levels of accuracy. Previous known methods of phase angle correction involve analog calibration, relatively difficult digital-signal processing, and/or relatively high-speed sampling.

While various analog adjustments are possible, it is believed that this analog proposal lacks the precision and consistency of digital approaches.

It is also believed that known digital-signal processing proposals are not ideal. While a phase-shifting digital filter is possible, it is believed that the computation of coefficients is relatively complicated for calibration and the real-time requirements are relatively excessive.

Another known digital-signal processing or "digital shift" approach requires a re-sampling process in which a number of zeros are inserted into the digital data stream and the high-frequency content is digitally removed with a low-pass digital filter. It is believed that this proposal is relatively computationally intense and could interfere with real-time performance.

In a relatively high-speed digital sampling approach, in order for the sampling rate to be high enough for a suitable resolution (e.g., about 0.05 degree resolution), at least 7200 samples/cycle are required. However, such an approach increases cost and complexity.

Accordingly, there is room for improvement in meter apparatus and methods for compensating for phase differences between alternating current waveforms.

SUMMARY OF THE INVENTION

These needs and others are met by the present invention, which employs a phase angle compensation factor and adjusts sampled values of one alternating current waveform to correspond with sampled values of another alternating current waveform by interpolating between pairs of sampled values of such one alternating current waveform based upon the phase angle compensation factor.

In accordance with one aspect of the invention, a method of compensating for phase differences between sampled values of first and second alternating current waveforms comprises: employing a phase angle compensation factor; sequentially sampling a plurality of values of each of the first and second alternating current waveforms; and adjusting the sampled values of the second alternating current waveform to correspond with the sampled values of the first alternating current waveform by employing, for a corresponding one of the sampled values of the second alternating current waveform, a preceding sampled value of the second alternating current waveform plus the product of: (i) the phase angle compensation factor and (ii) the difference between the corresponding one of the sampled values and the preceding sampled value, when the phase angle compensation factor is positive, or alternatively adjusting the sampled values of the second alternating current waveform to correspond with the sampled values of the first alternating current waveform by employing, for the corresponding one of the sampled values, the preceding sampled value minus the product of: (i) the sum of one plus the phase angle compensation factor and (ii) the difference between the preceding sampled value and the sampled value of the second alternating current waveform preceding the preceding sampled value, when the phase angle compensation factor is negative.

The method may sequentially sample the values of each of the first and second alternating current waveforms at a rate of about 512 samples per alternating current cycle; and employ the phase angle compensation factor, which has an absolute value that is smaller than one.

The method may acquire a plurality of sets of voltage samples and current samples as sampled values of each of the first and second alternating current waveforms; determine a plurality of zero crossings in the voltage samples; calculate a plurality of zero crossing sample times for the voltage samples; determine a plurality of zero crossings in the current samples; calculate a plurality of zero crossing sample times for the current samples; calculate a plurality of differences between the zero crossing sample times for the voltage samples and the zero crossing sample times for the current samples; and average the differences to provide the phase angle compensation factor.

The method may increment and store a count for each of the sets of voltage samples and current samples; calculate the zero crossing sample times for the voltage samples by employing, for a corresponding one of the zero crossing sample times and a corresponding one of the voltage samples, the stored count of the corresponding one of the voltage samples immediately before a corresponding one of the zero crossings plus the voltage of the voltage sample immediately before the corresponding one of the zero crossings divided by the difference between: (i) the voltage of the voltage sample immediately before the corresponding one of the zero crossings and (ii) the voltage of the voltage sample immediately after the corresponding one of the zero crossings; and calculate the zero crossing sample times for the current samples by employing, for a corresponding one of the zero crossing sample times and a corresponding one of the current samples, the stored count of the corresponding one of the current samples immediately before a corresponding one of the zero crossings plus the current of the current sample immediately before the corresponding one of the zero crossings divided by the difference between: (i) the current of the current sample immediately before the corresponding one of the zero crossings and (ii) the current of the current sample immediately after the corresponding one of the zero crossings.

The method may determine the count of one of the voltage zero crossings and the current zero crossings; determine a plurality of differences between each of the zero crossing sample times for the voltage samples and corresponding ones of the zero crossing sample times for the current samples; sum the differences between each of the zero crossing sample times for the voltage samples and corresponding ones of the zero crossing sample times for the current samples; and divide the sum of the differences by the count of one of the voltage zero crossings and the current zero crossings to determine the phase angle compensation factor.

As another aspect of the invention, a meter apparatus comprises: a plurality of first inputs adapted to receive at least one first alternating current waveform; a plurality of second inputs adapted to receive at least one second alternating current waveform; an analog to digital converter circuit adapted to sequentially sample and convert the received at least one first alternating current waveform to a plurality of first digital values and adapted to sequentially sample and convert the received at least one second alternating current waveform to a plurality of second digital values; a processor adapted to receive and process the first and second digital values from the analog to digital converter circuit, the processor including a compensation routine having a phase angle compensation factor, the compensation routine being adapted to adjust the second digital values to correspond with the first digital values by employing, for a corresponding one of the second digital values, a preceding one of the second digital values plus the product of: (i) the phase angle compensation factor and (ii) the difference between the corresponding one of the second digital values and the preceding one of the second digital values, when the phase angle compensation factor is positive, or the routine being adapted to alternatively adjust the second digital values to correspond with the first digital values by employing, for the corresponding one of the second digital values, the preceding one of the second digital values minus the product of: (i) the sum of one plus the phase angle compensation factor and (ii) the difference between the preceding one of the second digital values and the second digital value preceding the preceding one of the second digital values, when the phase angle compensation factor is negative, in order to compensate for phase differences between the first and second digital values.

The processor may further include a calibration routine adapted to receive and save a plurality of first and second digital calibration values from the analog to digital converter circuit, to communicate the saved first and second digital calibration values to an external calibration circuit, and to receive from the external calibration circuit the phase angle compensation factor.

The processor may further include a calibration routine adapted to calibrate the phase angle compensation factor.

The compensation routine of the processor may be a first compensation routine when the phase angle compensation factor is positive and a second different compensation routine when the phase angle compensation factor is negative.

As another aspect of the invention, a method of compensating for phase differences between sampled values of first and second alternating current waveforms comprises: employing a phase angle compensation factor; sequentially sampling a plurality of values of each of the first and second alternating current waveforms; and adjusting the sampled values of the second alternating current waveform to correspond with the sampled values of the first alternating current waveform by interpolating between a corresponding one of the sampled values of the second alternating current waveform and a preceding sampled value of the second alternating current waveform, when the phase angle compensation factor is positive, or by interpolating between the preceding sampled value and a sampled value of the second alternating current waveform preceding the preceding sampled value, when the phase angle compensation factor is negative.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The present invention is described in association with meters for determining power and/or energy from a plurality of alternating current (AC) voltage and current signals, although the invention is applicable to a wide range of electrical apparatus and methods associated with two or more AC signals.

Figure 1:
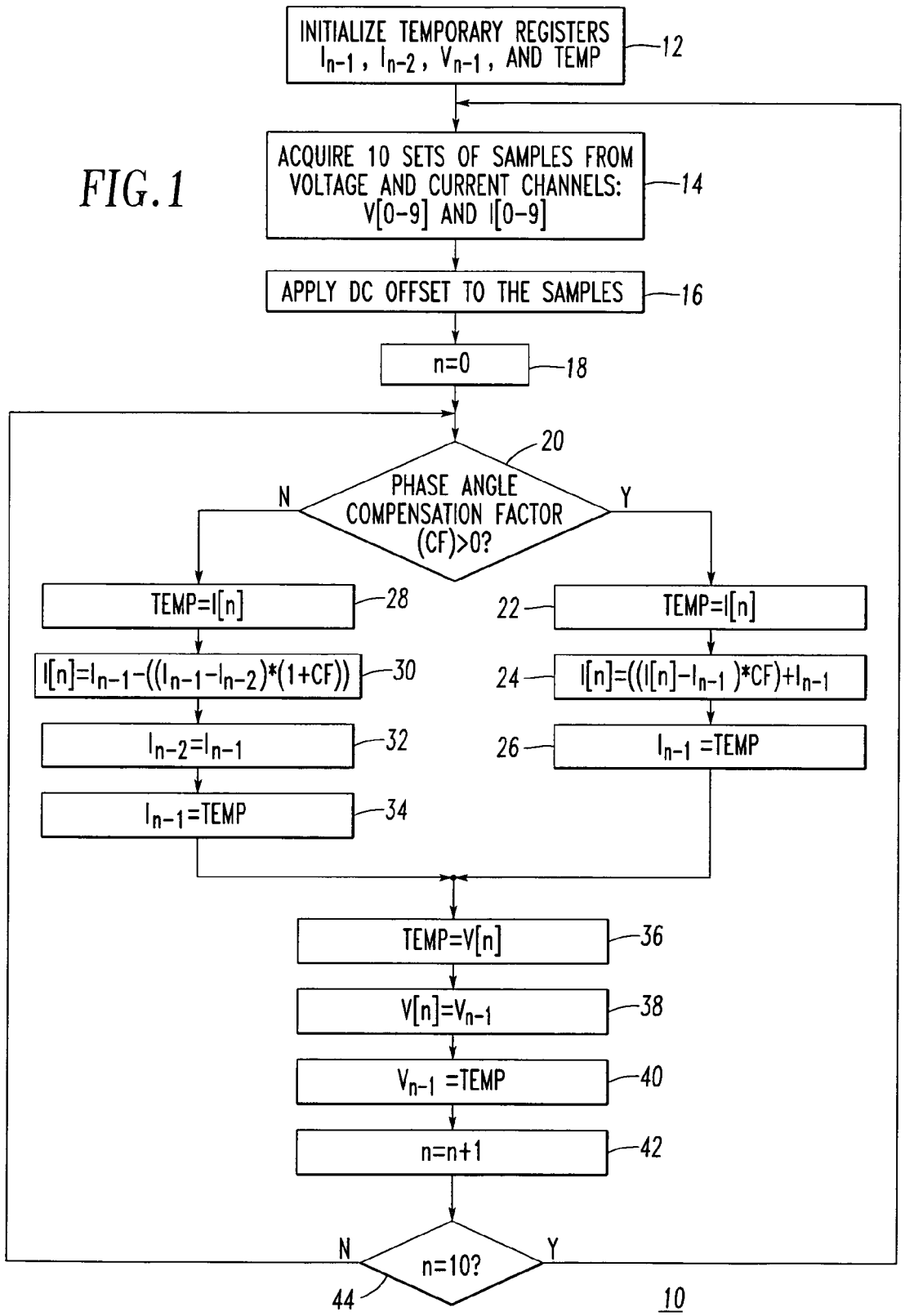
FIG. 1 is a flowchart of a compensation routine for phase angle compensation in accordance with the present invention.

Referring to FIG. 1, a flowchart of a compensation routine 10 is shown for phase angle compensation between sampled values of two AC waveforms. In this example, the phase angle compensation is applied to one of two time-varying voltage (V) and current (I) AC signals, although the invention is applicable to a wide range of signal types, to one or more phases (e.g., phase A, B and C) of current and voltage AC signals, and to application of phase angle compensation to the other of the two time-varying voltage (V) and current (I) AC signals.

First, at 12, temporary registers $I_{n-1}$, $I_{n-2}$, $V_{n-1}$ and Temp are initialized to zero. Next, at 14, ten sets of samples V[n] and I[n] from voltage and current channels (not shown), respectively, are acquired and saved for integer n ranging from 0 to 9. Although ten sets of samples are disclosed, one to nine, eleven or more sets of samples may be employed. Preferably, step 14 sequentially samples the values of each of the voltage and current waveforms from those channels at a rate of about 512 samples per AC cycle. Although an example sample rate is disclosed, a wide range of suitable smaller or larger sample rates may be employed. At 16, a predetermined direct current (DC) offset per channel may be applied to the samples. Preferably, this corrects for any known DC offset errors in the acquisition circuit (not shown) for each of the channels. Next, at 18, an integer, n, is set to zero. Then, at 20, it is determined if a predetermined phase angle compensation factor (CF) is greater than zero. If so, then steps 22, 24 and 26 are executed. Otherwise, steps 28, 30, 32 and 34 are executed. Each of those sequences of steps 22,24,26 and 28,30,32,34 adjusts one of the sampled values of the current waveform to correspond with the corresponding sampled value of the voltage waveform.

At 22, the first of the current samples, I[n], is saved in the temporary register, Temp. Next, at 24, the adjusted value of the first current sample, I[n], is determined from Equation 1:

$$I[n]=((I[n]-I_{n-1})*CF)+I_{n-1} \quad \text{(Eq. 1)}$$

Then, at 26, the temporary register, $I_{n-1}$, is set equal to the temporary register, Temp. Typically, the phase angle compensation factor (CF) has an absolute value that is smaller than one.

Otherwise, for the predetermined phase angle compensation factor (CF) being less than zero, at 28, the first of the current samples, I[n], is saved in the temporary register, Temp. Next, at 30, the adjusted value of the first current sample, I[n], is determined from Equation 2:

$$I[n]=I_{n-1}-((I_{n-1}-I_{n-2})*(1+CF)) \quad \text{(Eq. 2)}$$

Then, at 32, the temporary register, $I_{n-2}$, is set equal to the temporary register, $I_{n-1}$. Next, at 34, the temporary register, $I_{n-1}$, is set equal to the temporary register, Temp.

From Equations 1 and 2, it will be appreciated that no compensation is employed if the predetermined phase angle compensation factor (CF) is zero.

At 36, the temporary register, Temp, is set equal to the first of the voltage samples, V[n]. Next, at 38, the first voltage sample, V[n], is set equal to the temporary register, $V_{n-1}$. Then, at 40, the temporary register, $V_{n-1}$, is set equal to the temporary register, Temp. Next, at 42, the integer, n, is incremented. Finally, at 44, if the integer, n, is equal to ten, then execution resumes at 14, where a subsequent set of ten voltage and current samples is acquired. Otherwise, execution resumes at 20 for the next set of I[n] and V[n].

The routine 10 adjusts the sampled values of the current AC waveform to correspond with the sampled values of the voltage AC waveform by interpolating, at 24, between a corresponding one of the sampled values of the current AC waveform and a preceding sampled value of the current AC waveform, when the phase angle compensation factor (CF) is positive, or by interpolating, at 30, between the preceding sampled value and a sampled value of the current AC waveform preceding the preceding sampled value, when the phase angle compensation factor (CF) is negative.

In this example, with the variables being initialized to zero at step 12, this will cause an error in the first current sample if CF is positive, or an error in the first and second samples if CF is negative. This error is insignificant in meter applications and happens only on start up or power up. Alternatively, the first two current samples may be ignored.

Figure 2:
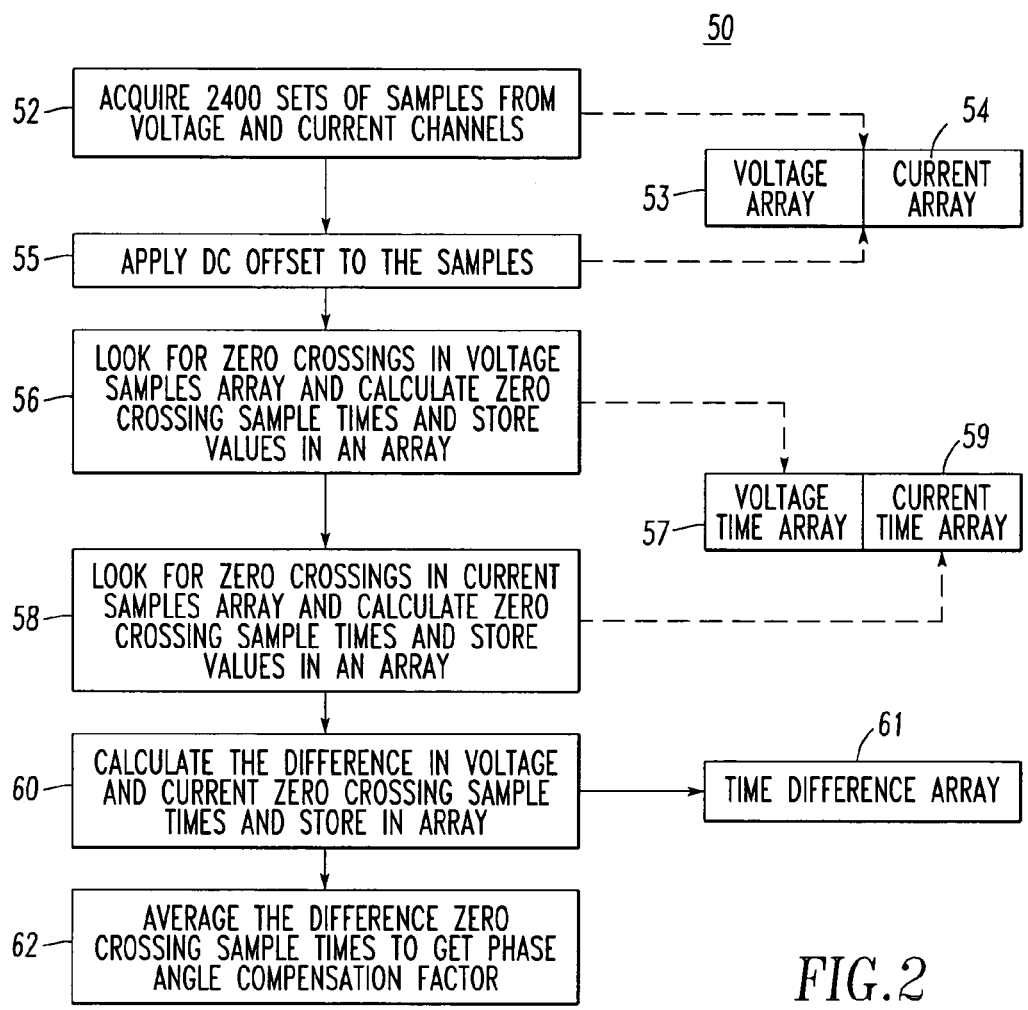
FIG. 2 is a flowchart of a calibration routine for calculating the phase angle compensation factor of FIG. 1.

FIG. 2 shows a flowchart of a calibration routine 50 for calculating the phase angle compensation factor (CF) of FIG. 1. In this example, first, at 52, 2400 sets of digital samples are acquired from the voltage and current channels (not shown) and are stored in a voltage array 53 and a current array 54. Here, the actual phase error between a voltage channel and the corresponding current channel is determined by preferably inputting pure in-phase sinusoidal signals into the voltage and current channels. Although 2400 sets of samples is disclosed, a wide range of sample set counts may be employed. Next, at 55, a predetermined DC offset per channel may be applied to each of the samples in the arrays 53,54. Preferably, this corrects for any known DC offset errors in the acquisition circuit (not shown) for each of the channels. Then, at 56, zero crossings are determined from the values in the voltage array 53 and, also, zero crossing sample times are calculated and those values are stored in a voltage time array 57. Next, at 58, zero crossings are determined from the values in the current array 54 and, also, zero crossing sample times are calculated and those values are stored in a current time array 59. Then, at 60, differences between the voltage and current crossing sample times from the arrays 57,59 are determined and stored in a time difference array 61. Finally, at 62, the various time differences in the array 61 are averaged, in order to obtain the phase angle compensation factor (CF). This phase angle compensation factor (CF) is stored and employed, as was discussed above in connection with FIG. 1, in order to determine how far to interpolate between the current digital samples in the array 54.

Figure 3:
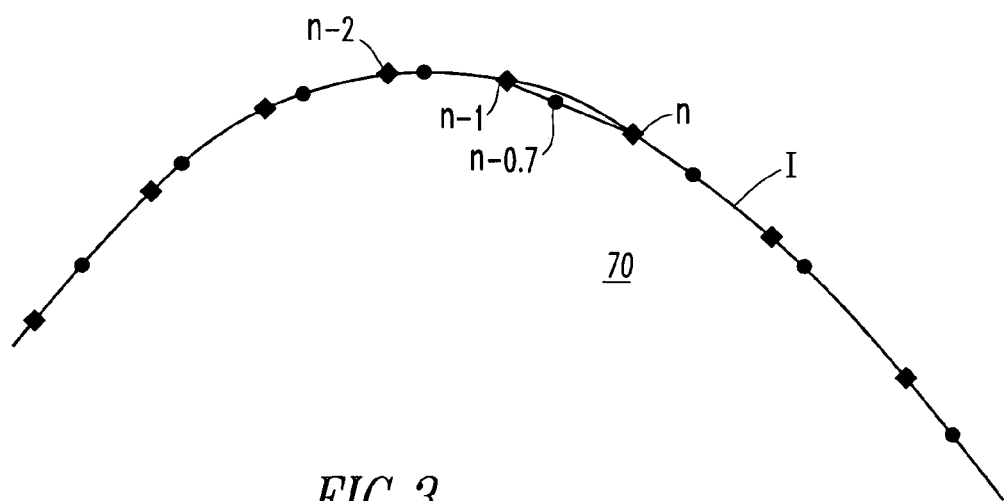
FIG. 3 is a plot of a portion of a current waveform showing application of the phase angle compensation factor of FIG. 1.

FIG. 3 shows an example plot 70 of a portion of a current AC waveform (I) including application of the phase angle compensation factor (CF) of FIG. 1. This compensates for the relative phase shift of one or more current channels (not shown) with respect to corresponding one or more voltage channels (not shown) associated with the determination of electrical power and/or energy. The effect of phase errors between the current and voltage channels is corrected by linearly interpolating a synthesized sample time between adjacent current digital samples, such as those at times n and n−1, or between those at times n−1 and n−2.

In an AC power system (not shown), this is practical at rates as low as about 64 samples/cycle and at rates as high as desired. For example, with a specific implementation employing 512 samples per cycle, the acquisition subsystem (not shown) is expected to be accurate within about a few tenths of a degree, although one sample time is about 0.7 degree in this example. As a result, phase correction needs to be much less than one sample time.

In order to correct the phase of the current waveform (I) by less than one sample time, the compensation routine 10 of FIG. 1 linearly interpolates between adjacent digital samples. Specifically, three digital samples are employed, in order to provide a range of +/−1 sample time (i.e., about +/−0.7 degree at 512 samples/cycle). If the corresponding voltage waveform (not shown) is digitally sampled at sample time "n−1", then the three corresponding current digital samples are at sample times "n", "n−1" and "n−2".

For example, as shown in FIG. 3, to advance the current phase by about 0.211 degree (i.e., 0.2109375 degree at 512 samples/cycle), use sample times "n−1" and "n," in order to artificially create a digital sample at sample time "n−0.7". In other words, linearly interpolate three tenths (i.e., CF=+0.3) of the way between the digital values at sample times "n−1" and "n".

As another example, to retard the current phase by about 0.07 degree (i.e., 0.0703125 degree at 512 samples/cycle), use sample times "n−2" and "n−1," in order to artificially create a digital sample at sample time "n−1.1" (not shown). In other words, linearly interpolate a tenth of the way between the digital values at sample times "n−1" and "n−2".

In practice, the actual phase error is preferably measured and the result is stored, as was discussed above in connection with FIG. 2, and the stored result is employed in real time, as was discussed above in connection with FIG. 1.

As another example, if a sampling rate of 64 samples per cycle is employed, then the worst case error between the actual digital sample, if in phase, and the corrected digital sample is about 0.12%. This error decreases with increases in the sampling rate.

Figure 4A:
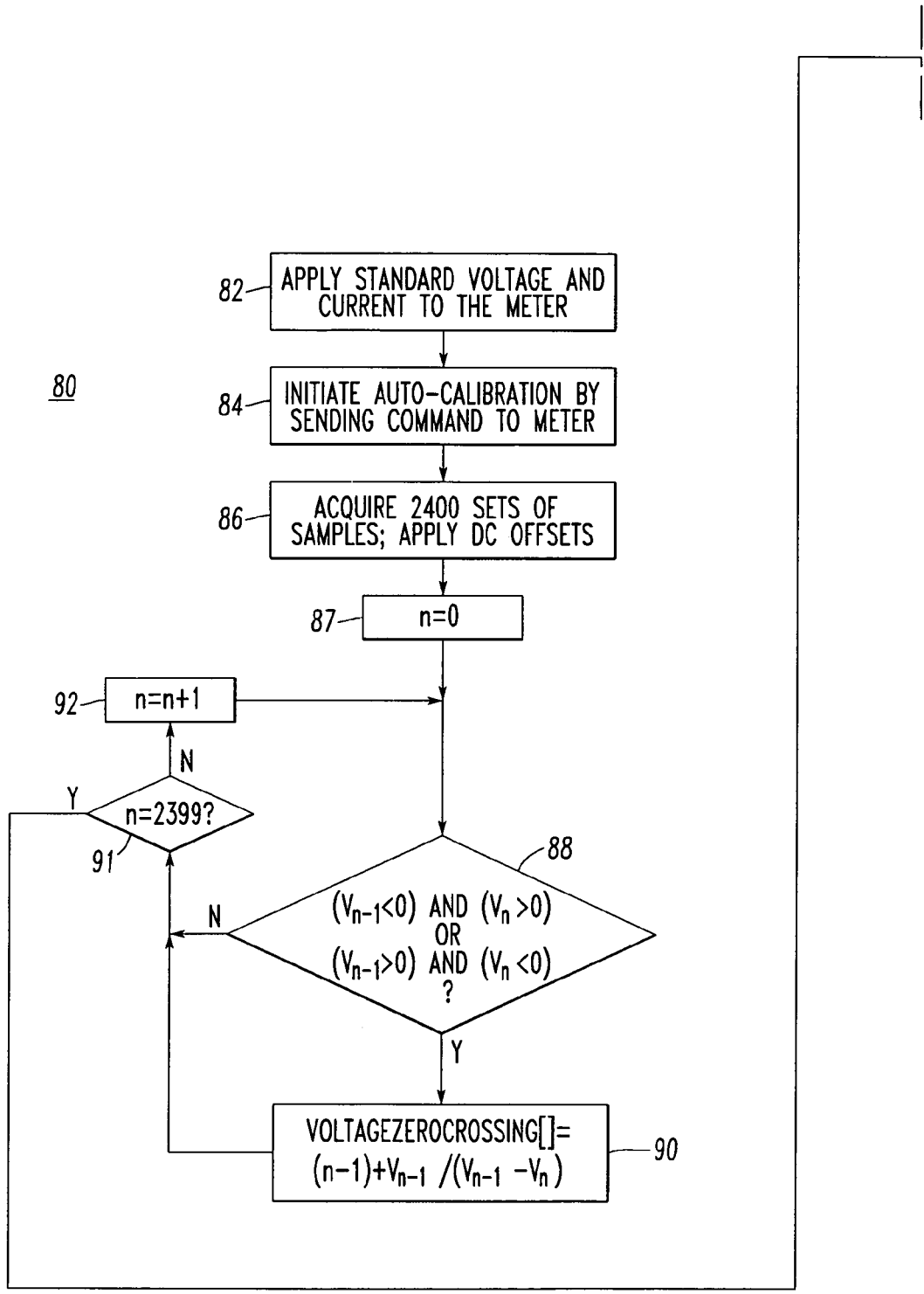
FIGS. 4A–4B form a flowchart of a routine for auto-calibrating a meter in accordance with an embodiment of the invention.
Figure 4B:
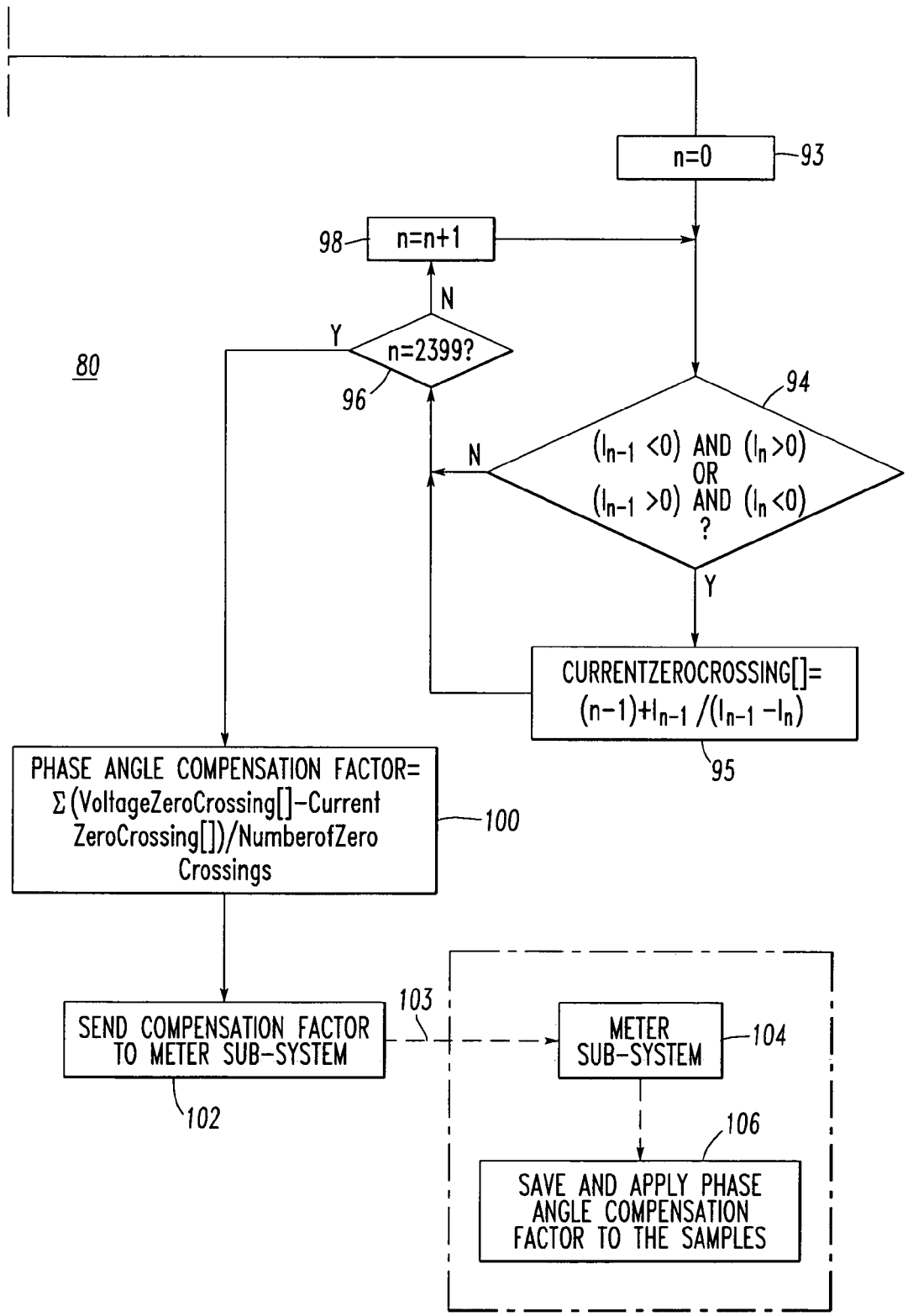

FIGS. 4A–4B show a flowchart of an auto-calibration routine 80 of a meter (not shown). First, at 82, standard voltage and current waveforms (not shown) are input to the meter. For example, the standard voltage and current waveforms (e.g., without limitation, 110 VAC at 60 Hz; 10 A at 60 Hz) are preferably pure in-phase sinusoidal signals, which are input into the voltage and current channels (not shown) of the meter. Next, at 84, a command (e.g., a suitable signal, such as, for example, a digital signal; a serial port signal; a data link signal; an input from a user interface) is input to the meter to start the auto-calibration. Then, at 86, as was discussed above in connection with steps 52 and 55 of FIG. 2, the routine 80 acquires 2400 sets of current and voltage digital samples and applies DC offsets thereto.

Next, at 87, the integer, n, is set to zero. Then, at 88, the logical expression of Equation 3 is determined to be either true or false, in order to find a voltage zero crossing:

$$(V_{n-1}<0) \text{ AND } (V_n>0) \text{ OR } (V_{n-1}>0) \text{ AND } (V_n<0) \quad \text{(Eq. 3)}$$

wherein:

$V_n$ is the voltage digital value at sample n; and $V_{n-1}$ is the preceding voltage digital value at sample n−1, except for n=0, wherein $V_{n-1}=0$ If the test at 88 is true, then at 90, the time of the voltage zero crossing, VoltageZeroCrossing[ ], is defined by Equation 4 with respect to the corresponding sample number:

$$\text{VoltageZeroCrossing}[\ ]=(n-1)+V_{n-1}/(V_{n-1}-V_n) \quad \text{(Eq. 4)}$$

Otherwise, or after step 90, it is determined if the integer, n, is equal to 2399. If so, then execution resumes at step 93. Otherwise, the integer, n, is incremented at 92 before step 88 is repeated for the next sample.

At 93, after all voltage samples are considered, the integer, n, is set to zero. Then, at 94, the logical expression of Equation 4 is determined to be either true or false, in order to find a current zero crossing:

$$(I_{n-1}<0) \text{ AND } (I_n>0) \text{ OR } (I_{n-1}>0) \text{ AND } (I_n<0) \quad \text{(Eq. 4)}$$

wherein:

$I_n$ is the current digital value at sample n; and $I_{n-1}$ is the preceding current digital value at sample n−1, except for n=0, wherein $I_{n-1}=0$.

If the test at 94 is true, then at 95, the time of the current zero crossing, CurrentZeroCrossing[ ], is defined by Equation 5 with respect to the corresponding sample number:

$$\text{CurrentZeroCrossing}[\ ]=(n-1)+I_{n-1}/(I_{n-1}-I_n) \quad \text{(Eq. 5)}$$

Otherwise, or after step 95, it is determined if the integer, n, is equal to 2399. If so, then execution resumes at step 100. Otherwise, the integer, n, is incremented at 98 before step 94 is repeated for the next sample.

Next, at 100, the phase angle compensation factor (CF) is determined from Equation 6:

$$CF = \frac{\sum_{i=1}^{j}(VoltageZeroCrossing\ [i] - CurrentZeroCrossing\ [i])}{ZeroCrossingCount} \quad \text{(Eq. 6)}$$

wherein:

i is an integer between 1 and j; and

ZeroCrossingCount is an integer count, j, of voltage or current zero crossings as determined at steps 90 or 95.

Then, at 102, the meter auto-calibration routine 80 sends the compensation factor (CF) 103 to the meter sub-system 104, which saves and applies, at 106, the compensation factor 103 to periodically acquired digital current samples (not shown).

Figure 5A:
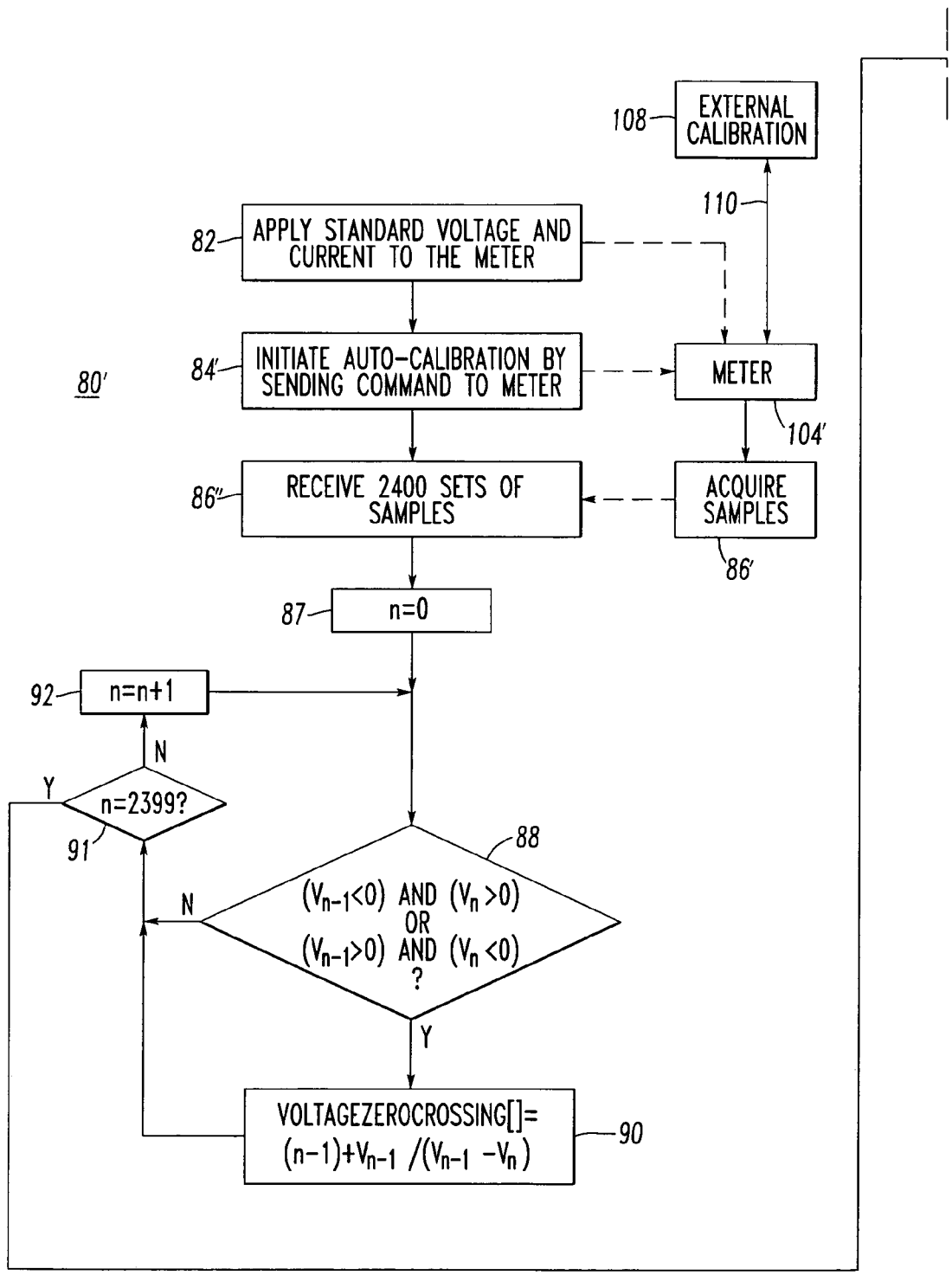
FIGS. 5A–5B form a flowchart of a routine for calibrating a meter with an external calibration system in accordance with another embodiment of the invention.
Figure 5B:
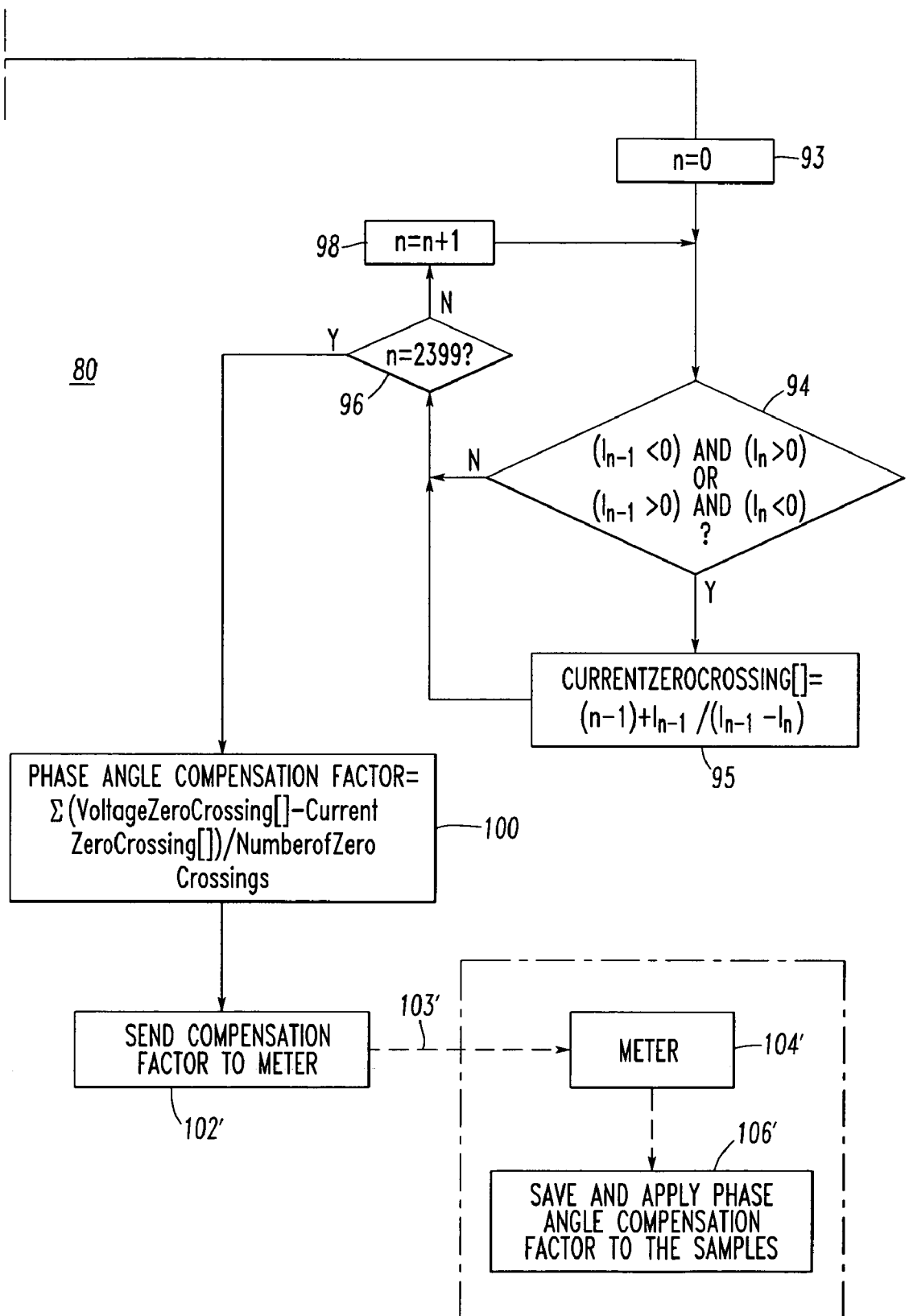

FIGS. 5A–5B show a flowchart of an external calibration system routine 80' for calibrating a meter 104'. The routine 80' is similar to the routine 80 of FIGS. 4A–4B, except that the routine 80' is executed by an external calibration system 108, while the auto-calibration routine 80 is internal to the meter (not shown) associated with the meter sub-system 104 of FIGS. 4A–4B, and except as shown by different reference characters in FIGS. 5A–5B. For simplicity of disclosure, only those different reference characters are discussed with respect to FIGS. 5A–5B.

At 84', a command (e.g., a suitable signal, such as, for example, a digital signal; a serial port signal; a data link signal) is output from the external calibration system 108 over a suitable port 110 (e.g., without limitation, a parallel port; a serial port; a data link; a communication network) to the meter 104' to start the calibration. Then, at 86', as was discussed above in connection with steps 52 and 55 of FIG. 2, a meter routine 86' acquires 2400 sets of current and voltage digital samples and applies DC offsets thereto. Next, at 86", the external calibration system 108 receives the 2400 sets of digital samples from the meter 104'.

At 102', after determining the compensation factor 103', the external calibration system 108 sends such compensation factor over the port 110 to the meter 104', which saves and applies, at 106', the compensation factor 103' to the periodically acquired digital current samples (not shown).

Figure 6:
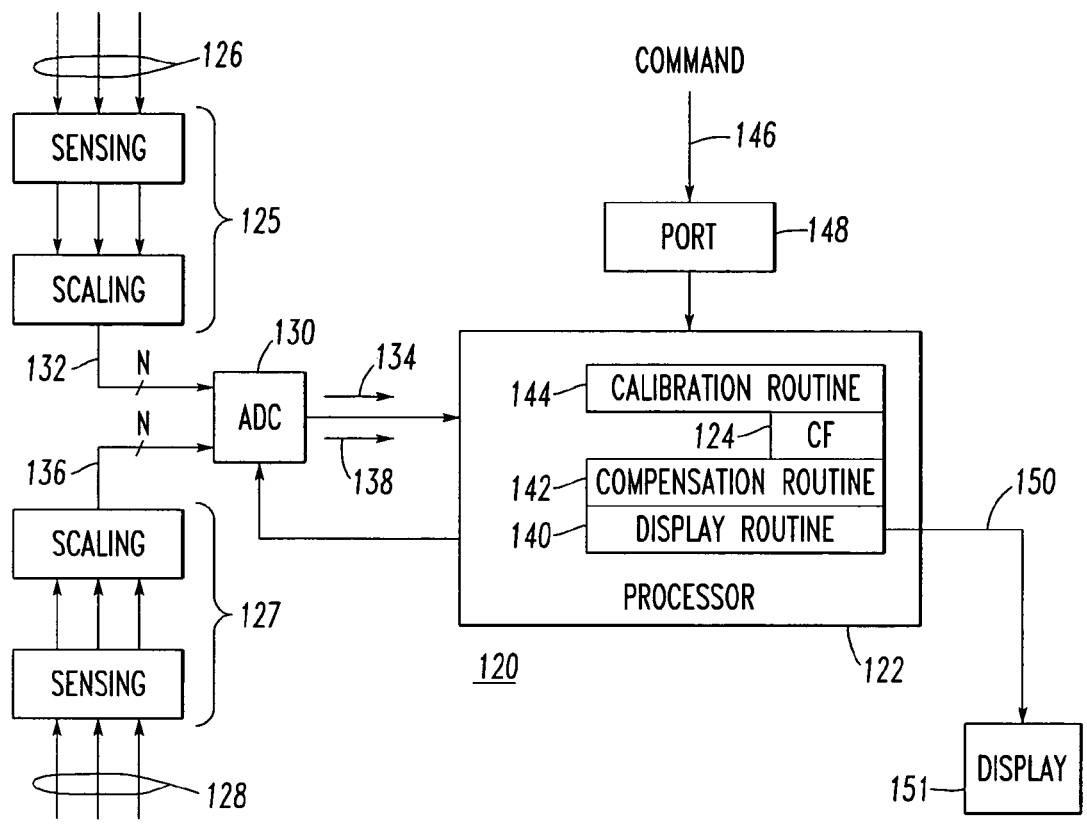
FIGS. 6–8 are block diagrams of meters including phase angle compensation in accordance with other embodiments of the invention.

FIG. 6 shows a meter 120 including a processor 122 employing a phase angle compensation factor (CF) 124. The meter 120 further includes one or more first inputs 125 adapted to receive one or more first AC waveforms 126 (e.g., without limitation, voltage waveforms), and one or more second inputs 127 adapted to receive one or more second AC waveforms 128 (e.g., without limitation, current waveforms). An analog to digital converter circuit (ADC) 130 is adapted to sequentially sample and convert received first AC waveforms 132 to a plurality of first digital values 134 and is adapted to sequentially sample and convert received second AC waveforms 136 to a plurality of second digital values 138.

The processor 122 includes a routine 140 adapted to receive and process the first and second digital values 134,138 from the ADC 130. In accordance with an important aspect of the invention, the routine 140 cooperates with a phase compensation routine 142 (e.g., which may be the same as or similar to the compensation routine 10 of FIG. 1) having the phase angle compensation factor (CF) 124, in order to compensate for phase differences between the sampled values 134,138. As is well known, the routine 140 and/or the ADC 130 may preferably include suitable DC offset and/or gain adjustments for the signals 134,138.

The processor 122 further includes a calibration routine 144 (e.g., which may be the same as or similar to the auto-calibration routine 80 of FIGS. 4A–4B) adapted to calibrate the phase angle compensation factor (CF) 124. The calibration routine 144 is executed at power up or start up (e.g., reset) and/or at any time responsive to a suitable command 146 received from port 148.

The routine 140 may determine power and/or energy values 150 for display on display 151 (e.g., a local or remote display).

Figure 7:
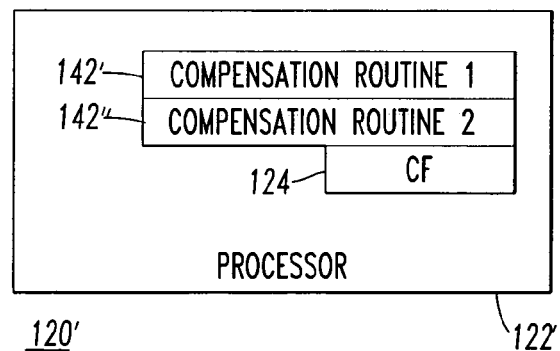

Referring to FIG. 7, another meter 120' including a processor 122' employing the phase angle compensation factor (CF) 124 is shown. Except as discussed, below, the meter 120' and processor 122' are the same as the respective meter 120 and processor 122 of FIG. 6. Here, instead of the phase compensation routine 142 of FIG. 6, the processor 122' includes one or both of a first phase compensation routine 142' and a second different phase compensation routine 142". The first compensation routine 142' (e.g., similar to the compensation routine 10 of FIG. 1, but excluding steps 28,30,32,34) is employed when the phase angle compensation factor 124 is positive and the second different compensation routine 142" (e.g., similar to the compensation routine 10 of FIG. 1, but excluding steps 22,24,26) is employed when the phase angle compensation factor 124 is negative.

Figure 8:
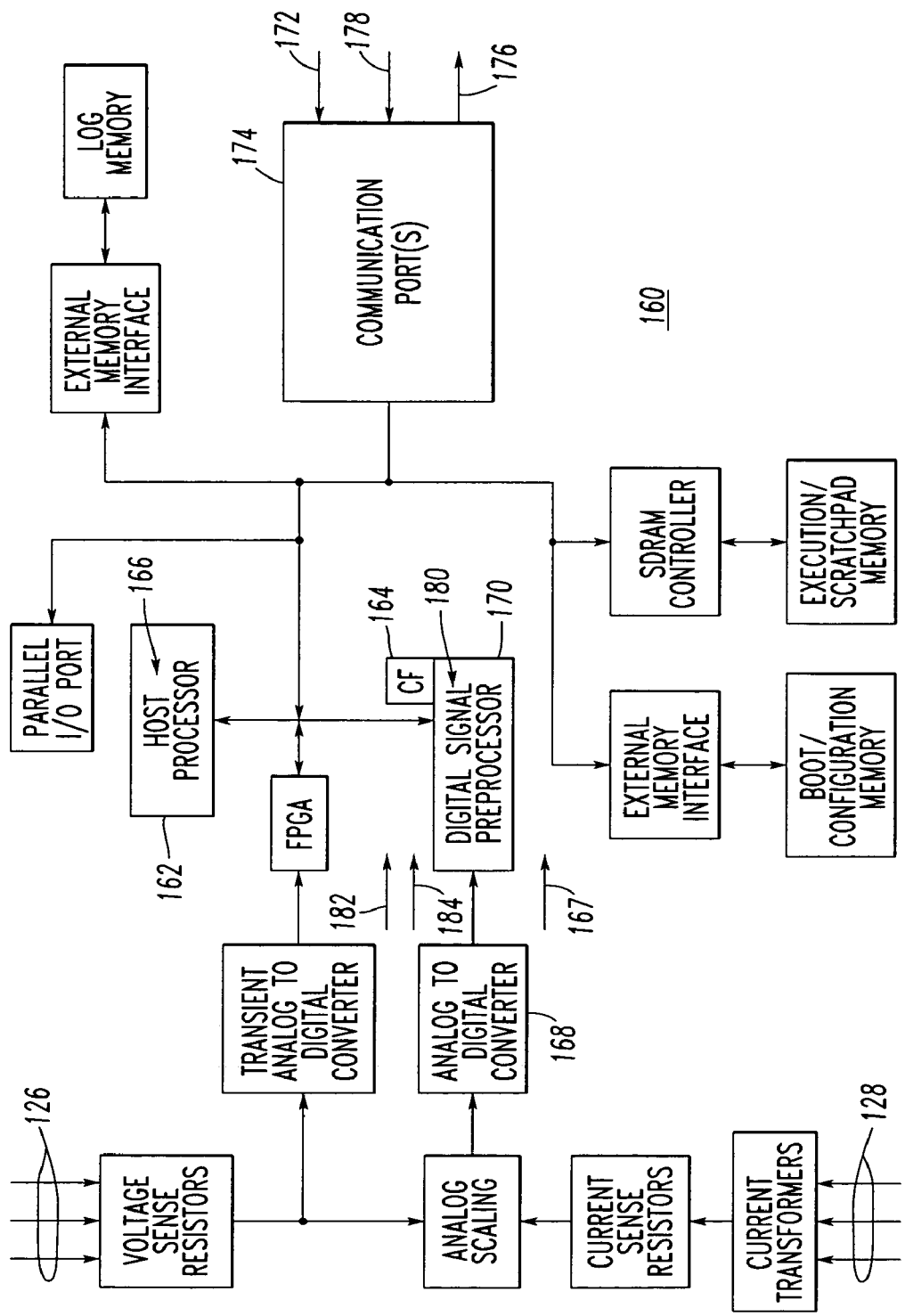

FIG. 8 shows another meter 160 including processors 162 and 170 employing a phase angle compensation factor (CF) 164. The meter 160 is adapted to cooperate with an external calibration system, such as the system 108 of FIG. 5A. The processor 162 includes an acquisition routine 166 adapted to receive and save a plurality of first and second digital calibration values 167 from an analog to digital converter 168. The acquisition routine 166 is executed at power up or start up of the meter 160 or at any time with a proper command responsive to a command 172 from the external calibration system 108 as received by a communication sub-system 174. In this example, the command 172 is communicated to the processor 170 through the processor circuit 162.

After the values 167 are acquired, the processor 170 communicates those through the host processor circuit 162 to the communication sub-system 174, which outputs those values in a message 176 to the external calibration system 108 of FIG. 5A. In turn, the external calibration system 108 determines an external phase angle compensation factor 178, which is received by the communication sub-system 174. In this example, the external compensation factor 178 is communicated to the processor 170 through the host processor 162. The host processor 162 saves the externally determined compensation factor 178 as the local compensation factor (CF) 164 and sends the same to the processor 170 to compensate the signals.

The processor 170 also includes a routine 180 employing the phase angle compensation factor (CF) 164, in order to compensate for phase differences between sampled values 182 and 184 from respective first and second AC waveforms 126 and 128. The routine 180 may be the same as or similar to the routines 140,142 of FIG. 6.

The communication sub-system 174 includes one or more suitable communication ports.

The disclosed phase compensation techniques provide digital precision for phase compensation without the hardware requirements of analog adjustment, relatively high-speed sampling and relatively complicated processing. This provides digital accuracy with relatively minimal processing.

Although FIGS. 1 and 3 show phase compensation being applied to the current AC signals, such compensation may alternatively be applied to voltage AC signals.

While for clarity of disclosure reference has been made herein to the exemplary display 151 for displaying power and/or energy values, it will be appreciated that such values may be stored, printed on hard copy, be computer modified, be sent to a remote display, or be combined with other data. All such processing shall be deemed to fall within the terms "display" or "displaying" as employed herein.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of compensating for phase differences between sampled values of first and second alternating current waveforms, said method comprising:
   employing a phase angle compensation factor;
   sequentially sampling a plurality of values of each of said first and second alternating current waveforms; and
   adjusting the sampled values of said second alternating current waveform to correspond with the sampled values of said first alternating current waveform by employing, for a corresponding one of said sampled values of said second alternating current waveform, a preceding sampled value of said second alternating current waveform plus the product of: (i) said phase angle compensation factor and (ii) the difference between said corresponding one of said sampled values and said preceding sampled value, when said phase angle compensation factor is positive, or
   alternatively adjusting the sampled values of said second alternating current waveform to correspond with the sampled values of said first alternating current waveform by employing, for said corresponding one of said sampled values, said preceding sampled value minus the product of: (i) the sum of one plus said phase angle compensation factor and (ii) the difference between said preceding sampled value and the sampled value of said second alternating current waveform preceding said preceding sampled value, when said phase angle compensation factor is negative.

2. The method of claim 1 further comprising:
   employing a meter;
   receiving said first and second alternating current waveforms at said meter;
   applying said phase angle compensation factor at said meter; and
   employing a circuit internal to said meter to calibrate said phase angle compensation factor.

3. The method of claim 1 further comprising:
   employing a meter;
   receiving said first and second alternating current waveforms at said meter;
   applying said phase angle compensation factor at said meter; and
   employing a circuit external to said meter to calibrate said phase angle compensation factor.

4. The method of claim 1 further comprising:
   employing as said first alternating current waveform a voltage alternating current waveform; and
   employing as said second alternating current waveform a current alternating current waveform.

5. The method of claim 1 further comprising:
   sequentially sampling the values of each of said first and second alternating current waveforms at a rate of about 512 samples per alternating current cycle; and
   employing said phase angle compensation factor, which has an absolute value that is smaller than one.

6. The method of claim 1 further comprising:
   acquiring a plurality of samples of said first and second alternating current waveforms before applying compensation to the sampled values of said second alternating current waveform.

7. The method of claim 1 further comprising:
applying a direct current offset to the samples of said first and second alternating current waveforms before applying compensation to the sampled values of said second alternating current waveform.

8. The method of claim 1 further comprising:
acquiring a plurality of sets of voltage samples and current samples as sampled values of each of said first and second alternating current waveforms;
determining a plurality of zero crossings in said voltage samples;
calculating a plurality of zero crossing sample times for said voltage samples;
determining a plurality of zero crossings in said current samples;
calculating a plurality of zero crossing sample times for said current samples;
calculating a plurality of differences between the zero crossing sample times for said voltage samples and the zero crossing sample times for said current samples; and
averaging said differences to provide said phase angle compensation factor.

9. The method of claim 8 further comprising:
applying a direct current offset to said voltage samples and said current samples before determining the zero crossings in said voltage samples and before determining the zero crossings in said current samples.

10. The method of claim 8 further comprising:
incrementing and storing a count for each of said sets of voltage samples and current samples;
calculating the zero crossing sample times for said voltage samples by employing, for a corresponding one of said zero crossing sample times and a corresponding one of said voltage samples, the stored count of said corresponding one of said voltage samples immediately before a corresponding one of said zero crossings plus the voltage of the voltage sample immediately before said corresponding one of said zero crossings divided by the difference between: (i) said voltage of the voltage sample immediately before said corresponding one of said zero crossings and (ii) the voltage of the voltage sample immediately after said corresponding one of said zero crossings; and
calculating the zero crossing sample times for said current samples by employing, for a corresponding one of said zero crossing sample times and a corresponding one of said current samples, the stored count of said corresponding one of said current samples immediately before a corresponding one of said zero crossings plus the current of the current sample immediately before said corresponding one of said zero crossings divided by the difference between: (i) said current of the current sample immediately before said corresponding one of said zero crossings and (ii) the current of the current sample immediately after said corresponding one of said zero crossings.

11. The method of claim 10 further comprising
determining the count of one of said voltage zero crossings and said current zero crossings;
determining a plurality of differences between each of said zero crossing sample times for said voltage samples and corresponding ones of said zero crossing sample times for said current samples;
summing said differences between each of said zero crossing sample times for said voltage samples and corresponding ones of said zero crossing sample times for said current samples; and
dividing the sum of said differences by said count of one of said voltage zero crossings and said current zero crossings to determine said phase angle compensation factor.

12. A meter apparatus comprising:
a first input adapted to receive at least one first alternating current waveform;
a second input adapted to receive at least one second alternating current waveform;
an analog to digital converter circuit adapted to sequentially sample and convert said received at least one first alternating current waveform to a plurality of first digital values and adapted to sequentially sample and convert said received at least one second alternating current waveform to a plurality of second digital values;
a processor adapted to receive and process the first and second digital values from said analog to digital converter circuit, said processor including a compensation routine having a phase angle compensation factor, said compensation routine being adapted to adjust said second digital values to correspond with said first digital values by employing, for a corresponding one of said second digital values, a preceding one of said second digital values plus the product of: (i) said phase angle compensation factor and (ii) the difference between said corresponding one of said second digital values and said preceding one of said second digital values, when said phase angle compensation factor is positive, or said routine being adapted to alternatively adjust said second digital values to correspond with said first digital values by employing, for said corresponding one of said second digital values, said preceding one of said second digital values minus the product of: (i) the sum of one plus said phase angle compensation factor and (ii) the difference between said preceding one of said second digital values and the second digital value preceding said preceding one of said second digital values, when said phase angle compensation factor is negative, in order to compensate for phase differences between said first and second digital values.

13. The meter apparatus of claim 12 wherein said processor further includes a calibration routine adapted to receive and save a plurality of first and second digital calibration values from said analog to digital converter circuit, to communicate said saved first and second digital calibration values to an external calibration circuit, and to receive from said external calibration circuit said phase angle compensation factor.

14. The meter apparatus of claim 12 wherein said processor further includes a calibration routine adapted to calibrate said phase angle compensation factor.

15. The meter apparatus of claim 14 wherein said calibration routine is adapted to acquire a plurality of sets of voltage samples and current samples as sampled values of each of said first and second alternating current waveforms, determine a plurality of zero crossings in said voltage samples, calculate a plurality of zero crossing sample times for said voltage samples, determine a plurality of zero crossings in said current samples, calculate a plurality of zero crossing sample times for said current samples, calculate a plurality of differences between the zero crossing sample times for said voltage samples and the zero crossing sample times for said current samples, and average said differences to provide said phase angle compensation factor.

16. The meter apparatus of claim 15 wherein said calibration routine is further adapted to apply a direct current offset to said voltage samples and said current samples before determining the zero crossings in said voltage samples and before determining the zero crossings in said current samples.

17. The meter apparatus of claim 15 wherein said calibration routine is further adapted to increment and store a count for each of said sets of voltage samples and current samples, calculate the zero crossing sample times for said voltage samples by employing, for a corresponding one of said zero crossing sample times and a corresponding one of said voltage samples, the stored count of said corresponding one of said voltage samples immediately before a corresponding one of said zero crossings plus the voltage of the voltage sample immediately before said corresponding one of said zero crossings divided by the difference between: (i) said voltage of the voltage sample immediately before said corresponding one of said zero crossings and (ii) the voltage of the voltage sample immediately after said corresponding one of said zero crossings, and calculate the zero crossing sample times for said current samples by employing, for a corresponding one of said zero crossing sample times and a corresponding one of said current samples, the stored count of said corresponding one of said current samples immediately before a corresponding one of said zero crossings plus the current of the current sample immediately before said corresponding one of said zero crossings divided by the difference between: (i) said current of the current sample immediately before said corresponding one of said zero crossings and (ii) the current of the current sample immediately after said corresponding one of said zero crossings.

18. The meter apparatus of claim 17 wherein said calibration routine is further adapted to determine the count of one of said voltage zero crossings and said current zero crossings, determine a plurality of differences between each of said zero crossing sample times for said voltage samples and corresponding ones of said zero crossing sample times for said current samples, sum said differences between each of said zero crossing sample times for said voltage samples and corresponding ones of said zero crossing sample times for said current samples, and divide the sum of said differences by said count of one of said voltage zero crossings and said current zero crossings to determine said phase angle compensation factor.

19. The meter apparatus of claim 12 wherein said processor further includes a routine to calculate energy from said first digital values and said adjusted second digital values.

20. The meter apparatus of claim 12 wherein the compensation routine of said processor is a first compensation routine when said phase angle compensation factor is positive and a second different compensation routine when said phase angle compensation factor is negative.

21. A method of compensating for phase differences between sampled values of first and second alternating current waveforms, said method comprising:
employing a phase angle compensation factor;
sequentially sampling a plurality of values of each of said first and second alternating current waveforms; and
adjusting the sampled values of said second alternating current waveform to correspond with the sampled values of said first alternating current waveform by interpolating between a corresponding one of said sampled values of said second alternating current waveform and a preceding sampled value of said second alternating current waveform, when said phase angle compensation factor is positive, or by interpolating between the preceding sampled value and a sampled value of said second alternating current waveform preceding said preceding sampled value, when said phase angle compensation factor is negative.

22. The method of claim 21 further comprising:
interpolating between said corresponding one of said sampled values of said second alternating current waveform and said preceding sampled value of said second alternating current waveform by a percentage defined by said positive phase angle compensation factor; and
alternatively interpolating between the preceding sampled value and said sampled value of said second alternating current waveform preceding said preceding sampled value by a percentage defined by said negative phase angle compensation factor.

* * * * *

UNITED STATES PATENT AND TRADEMARK OFFICE
CERTIFICATE OF CORRECTION

PATENT NO. : 6,975,951 B1
APPLICATION NO. : 10/865476
DATED : December 13, 2005
INVENTOR(S) : Praveen K. Sutrave et al.

It is certified that error appears in the above-identified patent and that said Letters Patent is hereby corrected as shown below:

Title Page, Column 1, Item (73) Assignee, "Raton" should read --Eaton--.

Signed and Sealed this
Twenty-eighth Day of May, 2013

Teresa Stanek Rea
*Acting Director of the United States Patent and Trademark Office*